(12) United States Patent
Juang

(10) Patent No.: US 6,384,685 B1
(45) Date of Patent: May 7, 2002

(54) COMPLEMENTARY METAL OXIDE SEMICONDUCTOR CLASS AB AMPLIFIER

(75) Inventor: Dar-Chang Juang, Hsinchu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 09/892,766

(22) Filed: Jun. 28, 2001

(51) Int. Cl.[7] ................................................. H03F 3/18
(52) U.S. Cl. ...................................... 330/264; 330/255
(58) Field of Search ............................... 330/255, 264, 330/267

(56) References Cited

U.S. PATENT DOCUMENTS 5,212,455 A * 5/1993 Pernici et al. ............... 330/253
5,789,980 A * 8/1998 Nagata et al. ............... 330/253
5,907,259 A * 5/1999 Yamada et al. ............. 327/563
6,163,217 A * 12/2000 Matsubara et al. ......... 330/255

* cited by examiner

Primary Examiner—Benny Lee
Assistant Examiner—Henry Choe
(74) Attorney, Agent, or Firm—Bacon & Thomas, PLLC

(57) ABSTRACT

A CMOS class AB amplifier has an adaptive level shift circuit, a compensated capacitor, and an output transistor pair. The adaptive level shift circuit includes a current mirror circuit, a diode transistor, a switch transistor, and a current source transistor. The diode transistor is utilized as a bias for driving the switch transistor so as to provide a relatively low linear resistor for being used as a feedback. Therefore, the Q (quality factor) value of the gyration inductance can be effectively reduced and the occurrence of the peak gain can be suppressed effectively, so as to maintain a desired gain margin.

10 Claims, 4 Drawing Sheets

COMPLEMENTARY METAL OXIDE SEMICONDUCTOR CLASS AB AMPLIFIER

BACKGROUND OF THE INVENTION

1. Field of the Invention

The present invention relates to an amplifier circuit, and especially to a complementary metal-oxide semiconductor (CMOS) class AB amplifier.

2. Description of Related Art

FIG. 4 shows a conventional class AB amplifier, which includes an input-stage formed by a differential amplifier 41, and an output stage formed by an class AB amplifier 42, so as to perform a differential operation on an input signal, and amplify and drive the same for output.

The AB class amplifier can be analyzed as follows: The class AB amplifier 42 with a loading capacitor $C_L$ has an open loop voltage gain, from node A to node O, expressed as:

$$A_{AO}(s) = \frac{V_O(s)}{V_A(s)} = \left(gm_2 + gm_1 gm_6 \frac{r_B}{sC_B r_B + 1}\right)\left(\frac{r_O}{sC_L r_O + 1}\right), \quad (1)$$

where $r_B = r_{ds4}//r_{ds5}$ is a DC resistance on node B; $r_o = r_{ds2}//r_{ds6}$ is an DC output resistance of the output stage; $gm_j$ represents transfer-conductance of a MOS transistor $M_j$, j=1,2,3 . . . ; $C_B = C_{DB4} + C_{DB5} + C_{GD4} + C_{GD5} + gm_6 r_O C_{GD6}$ is a parasitic capacitance of the output MOS transistor M6 and the current mirror amplifier consisting of MOS transistors M4 and M5.

When the class AB amplifier employs in an operational amplifier with a compensation capacitor $C_F$, its output impedance with a loading capacitor $C_L$ becomes:

$$y_O(s) = 1/z_O(s) = \frac{sC_F r_A + 1}{r_A} + \frac{sC_F r_A}{sC_F r_A + 1}\left(gm_2 + gm_1 gm_6 \frac{r_B}{sC_B r_B + 1}\right) + \frac{1}{r_O} + sC_L, \quad (2)$$

where $r_A$ is a DC resistance on node point A, i.e., an output resistance of the differential amplifier. If $\omega \gg 1/(r_A C_F)$, and $$gm_2 \gg \frac{1}{r_A} + \frac{1}{r_O},$$

we have $$y_{OH}(s) = 1/z_{OH}(s) = gm_2 + gm_1 gm_6 r_B \frac{1}{sC_B r_B + 1} + sC_L, \quad (3)$$

herein, the term $$gm_1 gm_6 r_B \frac{1}{sC_B r_B + 1}$$

represents a gyrated output inductor, where, $$L_{OEQ} \approx C_B/(gm_1 gm_6), \quad (4)$$

and with an equivalent series resistor:

$$R_{SEQ} = 1/(gm_1 gm_6 r_B). \quad (5)$$

Therefore, we have $$z_{OH}(s) = \frac{sr_B C_B + 1}{s^2 r_B C_L C_B + sC_L + sgm_2 r_B C_B + gm_1 gm_6 r_B + gm_2}, \quad (6)$$

Due to $gm_1 gm_6 r_B \gg gm_2$, $z_O(s)$ resonates at:

$$\omega_R = \sqrt{\frac{gm_1 gm_6 r_B + gm_2}{r_B C_B C_L}} \approx \sqrt{\frac{1}{r_B C_B}}\sqrt{\frac{gm_1 r_B gm_6}{C_L}} = \sqrt{\frac{gm_1 gm_6}{C_B C_L}} = \frac{1}{\sqrt{L_{OEQ} C_L}}, \quad (7)$$

$$Q_R = \frac{r_B}{C_L + gm_2 r_B C_B}\sqrt{gm_1 gm_6 C_B C_L} = \frac{\sqrt{gm_2 r_B C_B C_L}}{C_L + gm_2 r_B C_B}\sqrt{\frac{gm_1 r_B gm_6}{gm_2}}, \quad (8)$$

and has a resonated impedance:

$$|z_{OH}(j\omega_R)| = \left(\frac{1}{C_L + gm_2 r_B C_B}\right)\sqrt{\frac{C_B C_L}{gm_1 gm_6}}\sqrt{\frac{gm_1 gm_6 r_B^2 C_B}{C_L} + 1}. \quad (9)$$

If $\frac{gm_1 gm_6 r_B^2 C_B}{C_L} \gg 1$, we have:

$$|z_{OH}(j\omega_R)| \approx \frac{r_B C_B}{C_L + gm_2 r_B C_B}, \quad (10)$$

if $gm_2 r_B C_B \gg C_L$, we have $$|z_{OH}(j\omega_R)| \approx \frac{1}{gm_2}. \quad (11)$$

From the above analysis, it is known that the compensation capacitor $C_F$ in the operational amplifier will cause a gyration effect, so that the internal parasitic capacitance $C_B = C_{DB4} + C_{DB5} + C_{GD4} + C_{GD5} + gm_6 r_O C_{GD6}$ is gyrated to be the inductance in the output impedance. Therefore, the resonated output impedance $|Z_{OH}(j\omega_R)|$ always induces a peak gain on a operational amplifier around several 1 MHz to several 10 MHz. As a result, the gain margin of the operational amplifier is insufficient, or even becomes negative, which will cause a serious problem of oscillating. In general, to avoid this problem, it is necessary to design a very low gain margin for the differential amplifier at the output stage of the operational amplifier. However, such a design will cause various problem such as greatly decreasing the gain bandwidth and increasing the DC offset.

In Japan Patent publication No. 09-01823, there is disclosed an operational amplifier circuit which may alleviate the aforementioned problem by reducing the equivalent value of $r_B$. However, such a circuit will cause a problem of insufficient output driving ability, and thus the improvement is limited.

Therefore, it is desirable for the above conventional circuit to be improved so as to mitigate and/or obviate the aforementioned problems.

SUMMARY OF THE INVENTION

Accordingly, the object of the present invention is to provide a complementary metal oxide semiconductor class AB amplifier for achieving the purposes of saving power and having a large driving capability without sacrificing the gain bandwidth.

In accordance with one aspect of the present invention, there is provided a CMOS class AB amplifier having an adaptive level shift circuit, a compensation capacitor and an output transistor pair to receive an output of a differential amplifying circuit for being provided with a DC bias and a DC amplifying effect by the adaptive level shift circuit, phase compensated by the compensation capacitor, and driven by the output transistor pair. The adaptive level shift circuit comprises: a current mirror circuit having a first NMOS transistor and a second NMOS transistor, each having a gate connected to one another; a NMOS diode transistor having a gate and a drain connected to the gate; a NMOS switch transistor having a source connected to a drain of the second NMOS transistor of the current mirror circuit, a drain connected to a drain of the first NMOS transistor of the current mirror circuit and a source of the NMOS diode transistor, and a gate connected to the gate and drain of the NMOS diode transistor; a PMOS input amplifier transistor having a drain connected to the drain of the NMOS diode transistor; and, a PMOS current source transistor having a drain connected to the source of the NMOS switch transistor.

In accordance with another object of the present invention, there is provided a CMOS class AB amplifier having an adaptive level shift circuit, a compensation capacitor and an output transistor pair to receive an output of a differential amplifying circuit for being provided with a DC bias and a DC amplifying effect by the adaptive level shift circuit, phase compensated by the compensation capacitor, and driven by the output transistor pair. The adaptive level shift circuit comprises: a current mirror circuit having a first PMOS transistor and a second PMOS transistor, each having a gate connected to one another; a PMOS diode transistor having a gate and a drain connected to the gate; a PMOS switch transistor having a source connected to a drain of the second PMOS transistor of the current mirror circuit, a drain connected to a drain of the first PMOS transistor of the current mirror circuit and a source of the PMOS diode transistor, and a gate connected to the gate and drain of the PMOS diode transistor; a NMOS input amplifier transistor having a drain connected to the drain of the PMOS diode transistor; and, a NMOS current source transistor having a drain connected to the source of the PMOS switch transistor.

Other objects, advantages, and novel features of the invention will become more apparent from the following detailed description when taken in conjunction with the accompanying drawings.

DETAILED DESCRIPTION OF THE PREFERRED EMBODIMENT

To acquire the CMOS AB class amplifier in accordance with the present invention, at first, from the analysis in the description of related art, it is known that $C_B$ can be assumed to zero to suppress the resonance, so as to obtain an idea output impedance:

$$y_{OH\_Ideal} = 1/z_{OH\_Ideal} = gm_2 + gm_1 gm_6 r_B + sC_L \quad (12)$$

Therefore, the following impedance variation can be derived:

$$z_{OH}(s)/z_{OH\_ideal}(s) = \frac{(sC_L + gm_2 + gm_1 gm_6 r_B)(sr_B C_B + 1)}{s^2 r_B C_L C_B + sC_L + sgm_2 r_B C_B + gm_1 gm_6 r_B + gm_2} \quad (13)$$

$$= 1 + \frac{sgm_1 gm_6 r_B^2 C_B}{s^2 r_B C_L C_B + sC_L + sgm_2 r_B C_B + gm_1 gm_6 r_B + gm_2}.$$

Then, we have $$\frac{z_{OH}(j\omega_R)}{z_{OH\_Ideal}(j\omega_R)} = 1 + \frac{gm_1 gm_6 r_B^2 C_B}{C_L + gm_2 r_B C_B}, \quad (14)$$

and if $gm_2 r_B C_B >> C_L$, the maximum loss of gain margin is obtained:

$$\frac{z_{OH}(j\omega_R)}{z_{OH\_Ideal}(j\omega_R)} = 1 + \frac{gm_1 gm_6 r_B}{gm_2} \approx \frac{gm_1 gm_6 r_B}{gm_2}. \quad (15)$$

Figure 1:
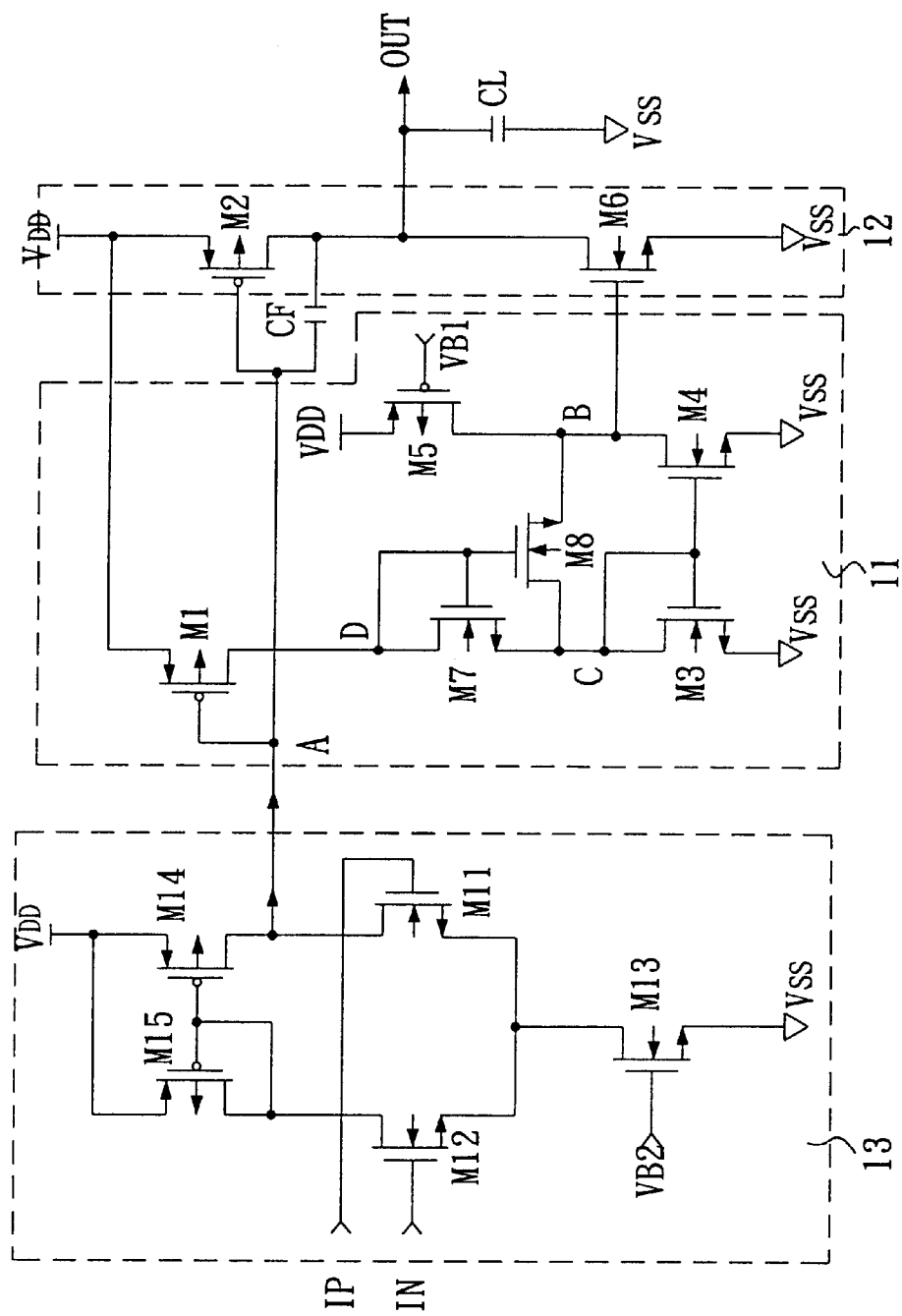
FIG. 1 is the circuit diagram of a CMOS AB class amplifier in accordance with a preferred embodiment of the present invention.

Referring to equations (14) and (15), it is known that the ideal method to suppress the resonation gain is to reduce the term $C_B$ to zero, but this is impossible. Therefore, a practical and preferred way is to reduce the value of $r_B$. To achieve this object, FIG. 1 depicts the CMOS class AB amplifier in accordance the present invention, which includes an adaptive level shift circuit 11, a compensation capacitor $C_F$, and an output transistor pair 12. This CMOS class AB amplifier receives an output from a differential amplifying circuit 13, and the adaptive level shift circuit 11 will provide a DC bias required for amplifying and a DC amplifying effect in line with the differential input I/P. After being phase compensated by the compensation capacitor $C_F$, the output is driven by the output transistor pair 12.

Referring to FIG. 1, the adaptive level shift circuit 11 includes a PMOS transistor M1, used as an input amplifier, a PMOS transistor M5, used as a current source, two NMOS transistors M3 and M4, used as a current mirror, a NMOS transistor M8, used as a switch, and a NMOS transistor M7, used as a diode. The gate of the transistor M1 is connected to an output (node A) of the differential amplifying circuit 13. The gate of the transistor M5 is connected to a bias terminalVB1. The sources of the transistors M1 and M5 are connected to a voltage source VDD, and the drains thereof are connected to the drain of the transistor M7 and the source of the transistor M8, respectively. The gates of the transistor M3 and M4 are connected together and further connected to the drain of the transistor M3. The transistors M1, M3, M4 and M5 are utilized to provide the DC bias and DC amplifying effect to a known level shift circuit.

The output transistor pair 12 is formed by connecting the drain of the PMOS transistor M2 to the drain of the NMOS transistor M6. The gate of the transistor M2 is connected to the gate of the transistor M1. The gate of the transistor M6 is connected to the source of the transistor M8. The compensation capacitor $C_F$ is connected between the drain of the transistor M2 and the gate of the transistor M1.

In the CMOS class AB amplifier in accordance with the present invention, the transistor M7 is connected between the output of the transistor M1 and the transistor M3 of the current mirror for providing a DC bias to control the transistor M8. As shown in the figure, the transistor M7 has its gate and drain connected together so as to be formed as a diode. The source of the transistor M8 is connected to the drain (node B) of the transistor M4. The drain of the transistor M8 is connected to the drain of the transistor M3 and the source of the transistor M7 (node C). The gate of the transistor M8 is connected to the connection point (node D) of the gate and drain of the transistor M7.

When the class AB amplifier in accordance with the present invention is working in small signal, the drain-source voltage Vds of the transistor M8 is relatively small; i.e., the transistor M8 is operating in a linear region (also known as a triode region), thereby providing a relatively small drain-source resistor $r_{DS7}$. Therefore, the output impedance of class AB amplifier is:

$$y_O(s) = 1/z_O(s) = \frac{sC_F r_A + 1}{r_A} + \qquad (16)$$
$$\frac{sC_F r_A}{sC_F r_A + 1}\left(gm_2 + \frac{1}{2}gm_1 gm_6 \frac{r_{DS8}}{sC_B r_{DS8} + 1}\right) + \frac{1}{r_O} + sC_L,$$

wherein $C_B = C_{GD8} + C_{DB8} + C_{DB4} + C_{DB5} + C_{GD4} + C_{GD5} + gm_6 r_O C_{GD6}$ will gyrate an output inductance:

$$L_{OEQ} \approx 2C_B/(gm_1 gm_6), \qquad (17)$$

which has an equivalent series resistance:

$$R_{SEQ} = 2/(gm_1 gm_6 r_{DS8}) \qquad (18)$$

If $\omega \gg 1/(r_A C_F)$ and $$gm_2 \gg \frac{1}{r_A} + \frac{1}{r_O},$$

it can be simplified as:

$$z_O(s) = \frac{(sC_B r_{DS8} + 1)/gm_2}{s^2 C_L C_B r_{DS8}/gm_2 + sC_L/gm_2 +} , \qquad (19)$$
$$sC_B r_{DS8} + gm_1 gm_6 r_{DS8}/2gm_2 + 1$$

and if $gm_1 gm_6 r_{DS8}/2 \gg gm_2$, the output impedance has a resonation frequency:

$$\omega_R = \sqrt{\frac{gm_1 gm_6 r_{DS8}/2 + gm_2}{r_{DS8} C_B C_L}} \approx \sqrt{\frac{1}{r_{DS8} C_B}}\sqrt{\frac{gm_1 r_{DS8} gm_6/2}{C_L}} = \qquad (20)$$
$$\sqrt{\frac{gm_1 gm_6}{2C_B C_L}} = \frac{1}{\sqrt{L_{OEQ} C_L}},$$

$$Q_R = \frac{r_{DS8}}{C_L + gm_2 r_{DS8} C_B}\sqrt{\frac{gm_1 gm_6 C_B C_L}{2}}, \qquad (21)$$

and a resonated impedance:

$$|z_{OH}(j\omega_R)| = \left(\frac{1}{C_L + gm_2 r_{DS8} C_B}\right)\sqrt{\frac{2C_B C_L}{gm_1 gm_6}}\sqrt{\frac{gm_1 gm_6 r_{DS8}^2 C_B}{2C_L} + 1}. \qquad (22)$$

Comparing with the ideal condition ($C_B$ approaches to zero to completely suppress the resonation) having an output impedance:

$$y_{OH\_Ideal} = 1/z_{OH\_Ideal} = gm_2 + gm_1 gm_6 r_B + sC_L, \qquad (23)$$

the following impedance variation can be derived:

$$z_{OH}(s)/z_{OH\_Ideal}(s) = 1 + \frac{sgm_1 gm_6 r_{DS8}^2 C_B/2}{s^2 r_{DS8} C_L C_B + sC_L +} , \qquad (24)$$
$$sgm_2 r_{DS8} C_B + gm_1 gm_6 r_{DS8}/2 + gm_2$$

and therefore we have:

$$\frac{z_{OH}(j\omega_R)}{z_{OH\_Ideal}(j\omega_R)} = 1 + \frac{1}{2}\frac{gm_1 gm_6 r_{DS8}^2 C_B}{C_L + gm_2 r_{DS8} C_B}. \qquad (25)$$

If $gm_2 r_{DS8} C_B \gg C_L$, the maximum loss of gain margin can be obtained:

$$\frac{z_{OH}(j\omega_R)}{z_{OH\_Ideal}(j\omega_R)} = 1 + \frac{gm_1 gm_6 r_{DS8}}{2gm_2} \approx \frac{gm_1 gm_6 r_{DS8}}{2gm_2}. \qquad (26)$$

Referring to the equations (14), (15), (25) and (26), it is known that the $r_{DS8}$ of the class AB amplifier in -accordance with the present invention is a resistor operating in a linear region, and the resistance value if about 110 K $\Omega$. Since the $r_{DS8}$ is farther small than $r_B$, the gain peak of the class AB amplifier in accordance with the present invention can be suppressed effectively.

When the class AB amplifier in accordance with the present invention is working in large signal to output a large source current, the node A at the input terminal will be pulled low. The transistor M2 will output a large source current, and the transistor M1 will conduct a transient current larger than a static current to flow through the transistor M7 and transistor M3. Since the transistors M4 and M3 are formed as a current mirror, the transistor M4 can also conduct such a large transient current. The transient current conducted by transistor M4 is larger than the stable bias current provided by the transistor M5 and therefore, the node B will be pulled down. The transistor M6 will approach to be turned off. As a result, the amplifier is in the class B mode to output a large source out current. In this transient state, although the transistor M8 and the transistor M7 are connected as a current mirror, the gain thereof is farther smaller than that of the transistor M3 to transistor M4. Consequently, the transistor M7 only conducts a minor current without affecting the pull down of node B, so as not to restrict the source out capability of the class AB amplifier.

Moreover, as the AB class amplifier of the present invention is working in large signal to conduct a large sink current, the node A will be pulled high so that the conducting currents of the transistors M1 and M2 are relatively small. Therefore, the conducting currents of the transistors M7, M8, M3 and M4 are also very small and are smaller than the stable bias current provided by the transistor M5. Thus, the node B will be pulled high to be close to the voltage source VDD. Thus, the transistor M6 can conduct a large current.

As a result, the amplifier is in the class B mode to conduct a large sink current from the load terminal.

Figure 2:
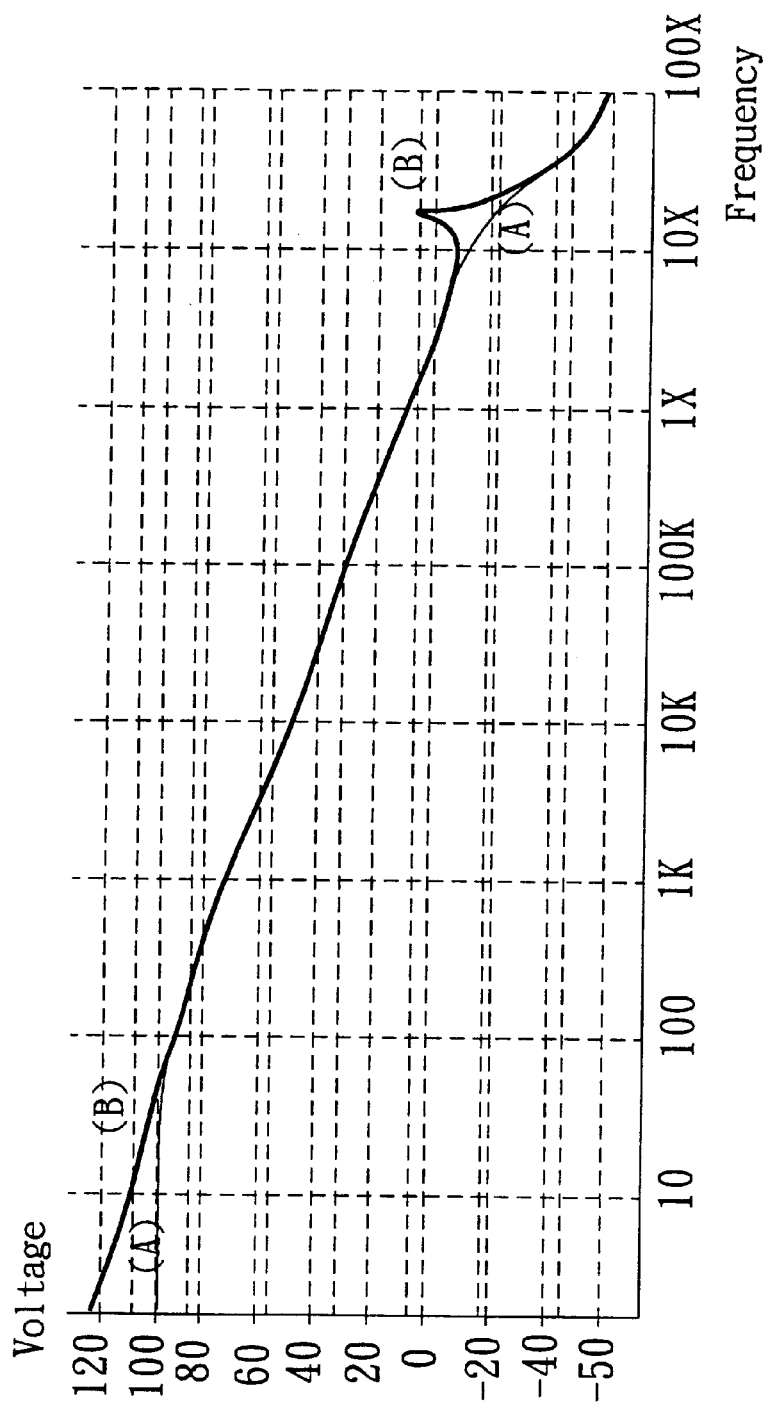
FIG. 2 shows a comparison of the phase curve of the present CMOS AB class amplifier with a load capacitor $C_L$ of 100 pF and the phase curve of the conventional amplifier.

FIG. 2 shows the phase curve (A) of the present class AB amplifier with a load capacitor $C_L$ of 100 pF and the phase curve (B) of the conventional amplifier. It is known that the class AB amplifier in accordance with the present invention is effective in suppressing the resonated peak gain.

Figure 3:
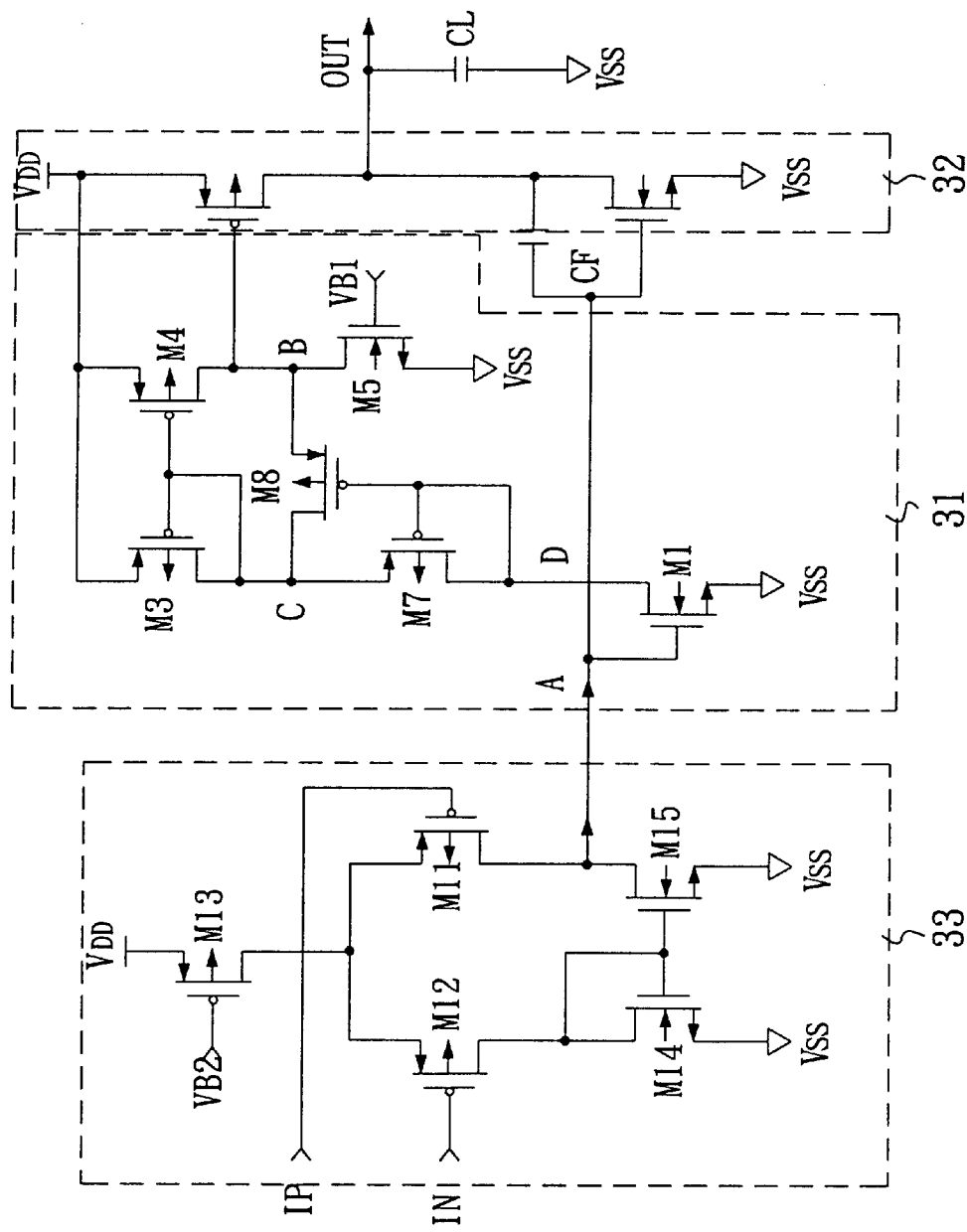
FIG. 3 is the circuit diagram of a CMOS AB class amplifier in accordance with another preferred embodiment of the present invention.
Figure 4:
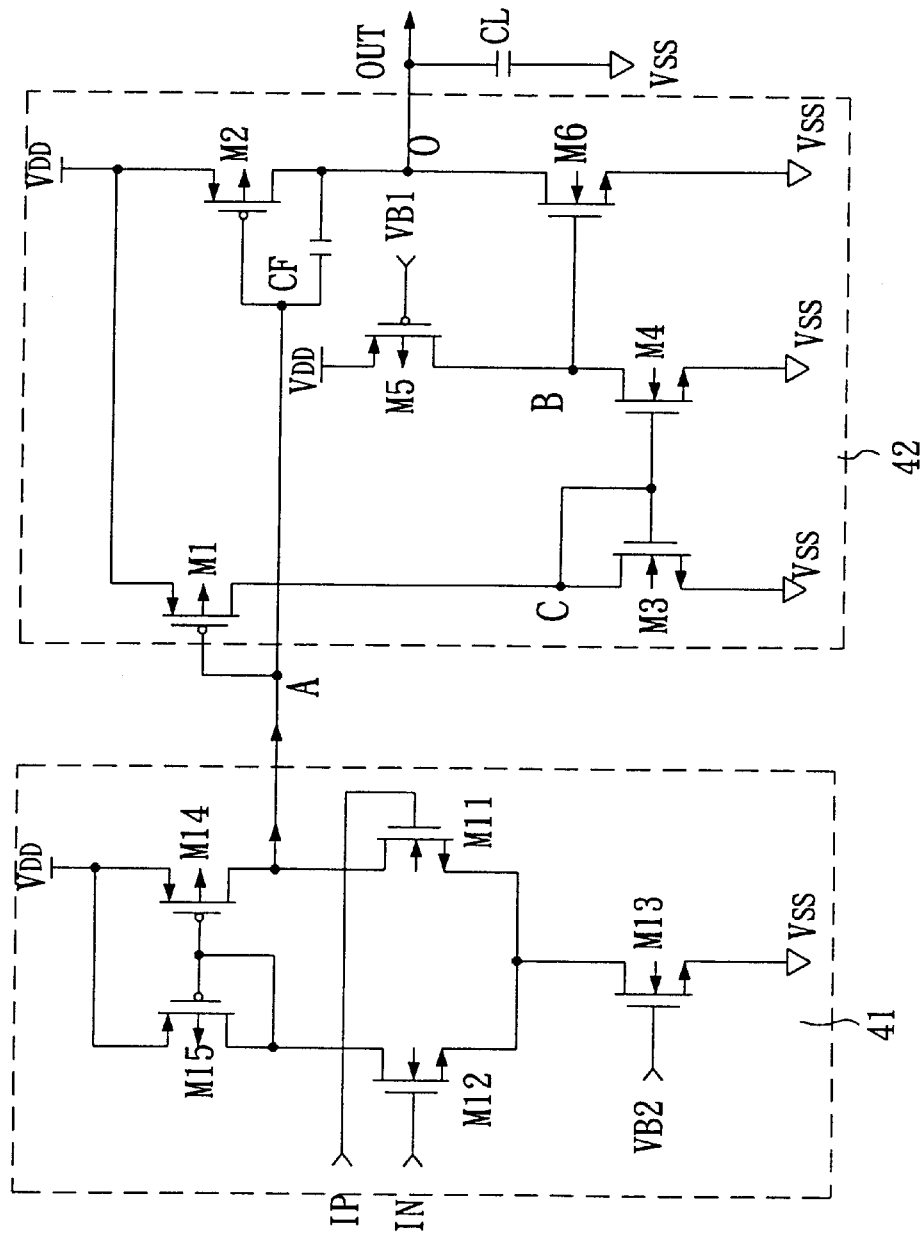
FIG. 4 is the circuit diagram of a conventional class AB amplifier.

With reference to FIG. 3, there is shown another preferred embodiment of the CMOS class AB amplifier in accordance with the present invention. The CMOS class AB amplifier includes an adaptive level shift circuit 31, a compensation capacitor $C_F$, and an output transistor pair 32. As shown in the figure, the adaptive level shift circuit 31 includes a NMOS transistor M1, used as an input amplifier, a NMOS transistor M5, used as a current source, two PMOS transistors M3 and M4, used as a current mirror, a PMOS transistor M8, used as a switch, and a PMOS transistor M7, used as a diode. The gate of the transistors M1 is connected to an output terminal (node A) of the differential amplifying circuit 33. The gate of the transistor M5 is connected to a bias terminal VB1. The sources of the transistors M1 and M5 are connected to a system low voltage VSS. The drains of the transistors M1 and M5 are connected to the drain of the transistor M7 and the source of the transistor M8, respectively. The gates of the transistors M3 and M4 are connected together and further connected to the drain of the transistor M3.

The output transistor pair 12 is formed by a NMOS transistor M2 and a PMOS transistor M6, each having a drain connected to one another. The gate of the transistor M2 is connected to the gate of the transistor M1. The gate of the transistor M6 is connected to the source of the transistor M8. The compensation capacitor $C_F$ is connected between the drain of the transistor M2 and the gate of the transistor M1. The transistor M7 is arranged between the output of the transistor M1 and the transistor M3 of the current mirror for providing a DC bias to control the transistor M8. As shown in the figure. The transistor M7 has its gate and drain connected together so as to be formed as a diode. The source of the transistor M8 is connected to the drain (node B) of the transistor M4. The drain of the transistor M8 is connected to the drain of the transistor M3 and the source of the transistor M7 (node C). The gate of the transistor M8 is connected to the connection point (node D) of the gate and drain of the transistor M7.

This preferred embodiment is different from the previous one in that the PMOS and NMOS transistors are replaced by NMOS and PMOS transistors, respectively. The operations of the two circuits are identical. Therefore, a detailed description for the operation of this embodiment is deemed unnecessary.

In view of the foregoing, it is known that, in the present invention, the transistor M7 is utilized as a bias for driving the transistor M8 so as to provide a relatively low linear resistor $r_{DSS}$ for being used as a feedback. Therefore, the Q value of the gyration inductance can be effectively reduced, and the occurrence of the peak gain can be suppressed effectively, so as to maintain a required gain margin. Moreover, the connections of the transistor M7 and transistor M8 still allow the driving voltage of the output transistor M6 not to be clamped in large signal. Therefore, the amplifier can work in the class AB mode to achieve the object of saving power and having a large driving capability without sacrificing the gain bandwidth.

Although the present invention has been explained in relation to its preferred embodiment, it is to be understood that many other possible modifications and variations can be made without departing from the spirit and scope of the invention as hereinafter claimed.

What is claimed is:

1. A complementary metal oxide semiconductor (CMOS) class AB amplifier having an adaptive level shift circuit, a compensation capacitor and an output transistor pair to receive an output of a differential amplifying circuit for being provided with a DC bias and a DC amplifing effect by the adaptive level shift circuit, phase compensated by the compensation capacitor, and driven by the output transistor pair, the adaptive level shift circuit comprising:

a current mirror circuit having a first NMOS transistor and a second NMOS transistor, each having a gate connected to one another;

a NMOS diode transistor having a gate and a drain connected to the gate;

a NMOS switch transistor having a source connected to a drain of the second NMOS transistor of the current mirror circuit, a drain connected to a drain of the first NMOS transistor of the current mirror circuit and a source of the NMOS diode transistor, and a gate connected to the gate and drain of the NMOS diode transistor;

a PMOS input amplifier transistor having a drain connected to the drain of the NMOS diode transistor; and a PMOS current source transistor having a drain connected to the source of the NMOS switch transistor.

2. The CMOS class AB amplifier as claimed in claim 1, wherein the output transistor pair comprises:

a PMOS transistor having a drain, a gate connected to the gate of the PMOS input amplifier transistor, and a source connected to a voltage source; and a NMOS transistor having a drain connected to the drain of the PMOS transistor, a gate connected to the source of the NMOS switch transistor, and a source connected to a system low voltage.

3. The CMOS class AB amplifier as claimed in claim 2, wherein the compensation capacitor is connected between the drain of the PMOS transistor and the gate of the PMOS input amplifier transistor.

4. The CMOS class AB amplifier as claimed in claim 1, wherein the PMOS input amplifier has a gate connected to an output terminal of the differential amplifying circuit and a source connected to a voltage source.

5. The CMOS class AB amplifier as claimed in claim 1, wherein the PMOS current source transistor has a gate connected to a bias terminal and a source connected to a voltage source.

6. A complementary metal oxide semiconductor (CMOS) class AB amplifier having an adaptive level shift circuit, a compensation capacitor and an output transistor pair to receive an output of a differential amplifying circuit for being provided with a DC bias and a DC amplifing effect by the adaptive level shift circuit, phase compensated by the compensation capacitor, and driven by the output transistor pair, the adaptive level shift circuit comprising:

a current mirror circuit having a first PMOS transistor and a second PMOS transistor, each having a gate connected to one another;

a PMOS diode transistor having a gate and a drain connected to the gate;

a PMOS switch transistor having a source connected to a drain of the second PMOS transistor of the current mirror circuit, a drain connected to a drain of the first PMOS transistor of the current mirror circuit and a source of the PMOS diode transistor, and a gate connected to the gate and drain of the PMOS diode transistor;

a NMOS input amplifier transistor having a drain connected to the drain of the PMOS diode transistor; and a NMOS current source transistor having a drain connected to the source of the PMOS switch transistor.

7. The CMOS class amplifier as claimed in claim 6, wherein the output transistor pair comprises:

a NMOS transistor having a drain, a gate connected to a gate of the NMOS input amplifier transistor, and a source connected to a system low voltage; and a PMOS transistor having a drain connected to the drain of the NMOS transistor, a gate connected to the source of the PMOS switch transistor, and a source connected to a voltage source.

8. The CMOS class AB amplifier as claimed in claim 7, wherein the compensation capacitor is connected between the drain of the NMOS transistor and the gate of the NMOS input amplifier transistor.

9. The CMOS class AB amplifier as claimed in claim 6, wherein the NMOS input amplifier has a gate connected to an output terminal of the differential amplifying circuit, and a source connected to a system low voltage.

10. The CMOS class AB amplifier as claimed in claim 6, wherein the NMOS current source transistor has a gate connected to a bias terminal, and a source connected to a system low voltage.

* * * * *